(12) United States Patent
Zhang et al.

(10) Patent No.: US 8,154,034 B1
(45) Date of Patent: Apr. 10, 2012

(54) METHOD FOR FABRICATING VERTICAL LIGHT EMITTING DEVICES AND SUBSTRATE ASSEMBLY FOR THE SAME

(75) Inventors: Jianping Zhang, El Monte, CA (US); Chunhui Yan, El Monte, CA (US)

(73) Assignee: Invenlux Limited, Central (HK)

( * ) Notice: Subject to any disclaimer, the term of this patent is extended or adjusted under 35 U.S.C. 154(b) by 0 days.

(21) Appl. No.: 12/953,290

(22) Filed: Nov. 23, 2010

(51) Int. Cl.
    *H01L 29/201* (2006.01)
(52) U.S. Cl. ........ 257/90; 438/41; 438/44; 257/E21.108
(58) Field of Classification Search .............. 257/90, 257/E21.108; 438/41, 44
See application file for complete search history.

(56) References Cited

U.S. PATENT DOCUMENTS

| | | | |
|---|---|---|---|
| 6,303,405 B1 * | 10/2001 | Yoshida et al. ............... | 438/46 |
| 6,911,351 B2 * | 6/2005 | Kidoguchi et al. ........... | 438/46 |
| 7,052,979 B2 * | 5/2006 | Nagai et al. .................. | 438/478 |
| 7,202,141 B2 | 4/2007 | Park et al. | |
| 7,781,247 B2 | 8/2010 | Tran et al. | |
| 2003/0189212 A1 | 10/2003 | Yoo ............................... | 257/79 |
| 2005/0247950 A1 | 11/2005 | Nakamura et al. | |
| 2009/0206362 A1 | 8/2009 | Sung et al. .................... | 257/103 |
| 2010/0068872 A1 * | 3/2010 | Chyi et al. .................... | 438/507 |
| 2010/0133505 A1 | 6/2010 | Takao et al. .................. | 257/13 |
| 2010/0261300 A1 | 10/2010 | Tu et al. ........................ | 438/29 |

FOREIGN PATENT DOCUMENTS

WO    WO 2009/035218    3/2009

OTHER PUBLICATIONS

Notification of Transmittal of the International Search Report and the Written Opinion of the International Searching Authority, or the Declaration of the International Application PCT/US2010/060137 dated Dec. 15, 2011.

\* cited by examiner

*Primary Examiner* — Trung Q Dang
(74) *Attorney, Agent, or Firm* — J.C. Patents

(57) ABSTRACT

In a method for fabricating a vertical light emitting device, the separation or lift-off of the substrate from the light emitting diode structure formed thereon is facilitated by forming voids at the interface between the substrate and the light emitting diode structure where the separation or lift-off occurs. A substrate assembly contains a substrate and an epitaxial layer, and voids are formed at the interface between the substrate and the epitaxial layer in a controlled manner. A light emitting diode structure is then formed on the epitaxial layer, followed by attaching the light emitting diode structure to a superstrate, separating the substrate from the epitaxial layer, and forming a conductive layer and a contact pad in place of the substrate, so as to form a vertical light emitting device.

19 Claims, 15 Drawing Sheets

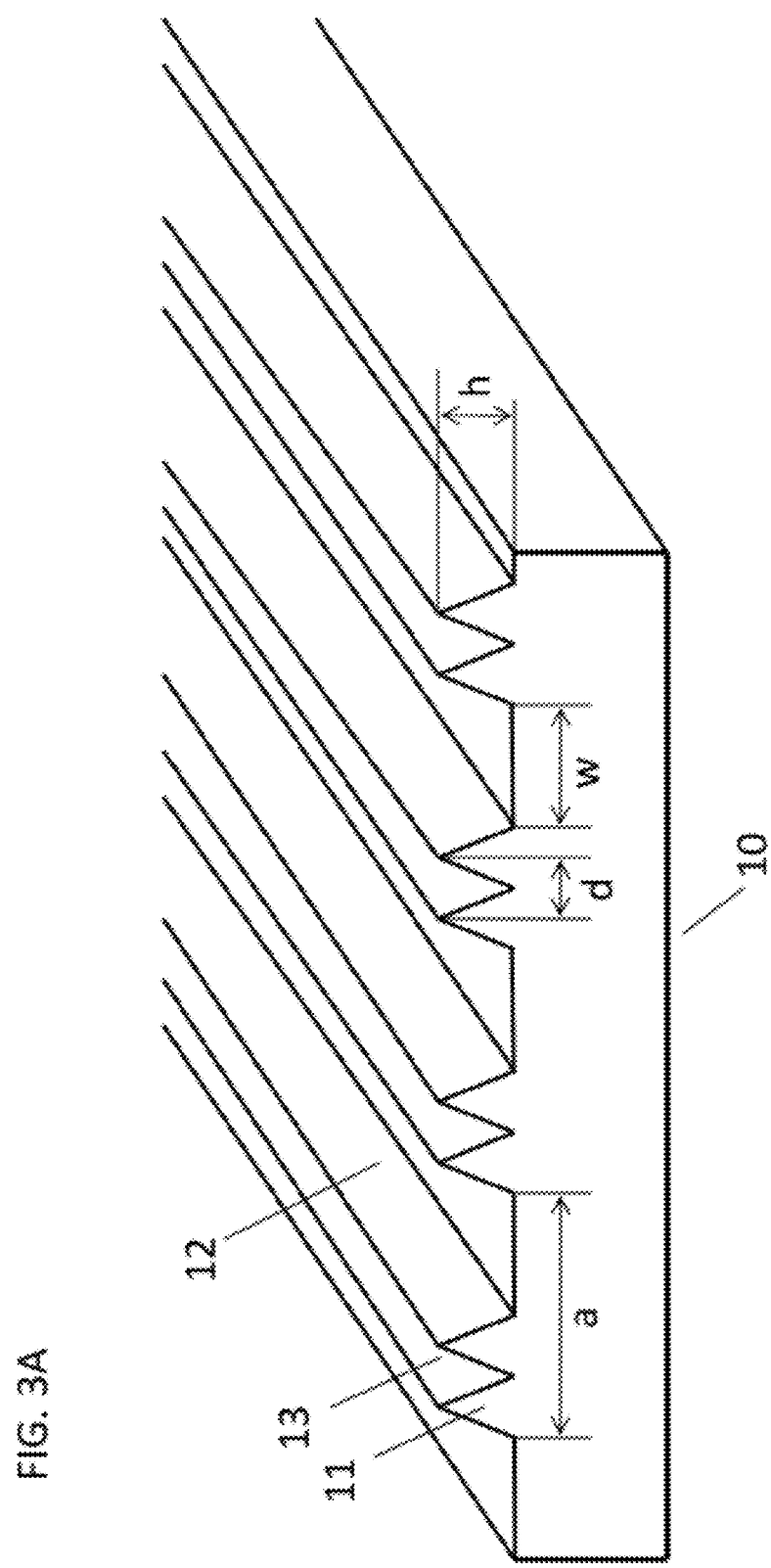

METHOD FOR FABRICATING VERTICAL LIGHT EMITTING DEVICES AND SUBSTRATE ASSEMBLY FOR THE SAME

1. FIELD OF THE INVENTION

The present invention relates in general to light-emitting devices, more particularly to a method for fabricating a vertical light-emitting device with improved device yield and light extraction efficiency, and a substrate assembly for the vertical light-emitting device.

2. DESCRIPTION OF THE RELATED ART

While still with the absence of commercial viable nitride bulk materials, the next generation general lighting enablers, nitride-based light-emitting diodes (LEDs), are currently heteroepitaxially formed over foreign substrates, such as sapphire, silicon carbide, and silicon. These substrates limit the LED applications in the high-power regime, for sapphire has a poor thermal dissipation capability, and silicon and conductive silicon carbide are opaque to visible light. One approach to overcome this limitation is to transfer the light-emitting structure to another substrate or superstrate with exceptional thermal dissipation capability and possibility to incorporate minors in-between the light-emitting structure and superstrate. The thin film transfer process involves bonding the thin film to a desired superstrate and separating the thin film from the original substrate.

For GaN-based LEDs on sapphire substrate, a laser lift-off technology has been developed. A reference to GaN laser lift-off can be found in U.S. Pat. No. 7,202,141, which is herein incorporated by reference in its entirety. In brief, a laser beam with photon energy larger than the bandgap of GaN is shone through sapphire on GaN-sapphire interface. The photon energy is absorbed by the interface GaN layer within a small thickness (<1 μm) and the process results in vaporizing of the interface GaN layer, producing high-pressure nitrogen gas to separate the light-emitting structure from the sapphire substrate. However, the high-pressure nitrogen vapor and the associated shockwave can introduce additional defects in the light-emitting structure, resulting in lower light-generation efficiency and larger device forward/reverse leakage, in a word, resulting in lower device yield and inferior device performance.

U.S. Pat. No. 7,781,247 and patent application publication No. 2005/0247950 have both pointed out the use of an InGaN sacrificing layer in-between the substrate and the light-emitting structure to improve the device lift-off quality and yield. Both U.S. Pat. No. 7,781,247 and patent application publication No. 2005/0247950 are herein incorporated by reference in its entirety. InGaN with a bandgap narrower than that of GaN can absorb more laser energy, limiting the damage to a less film thickness. Besides, InGaN dissociating at relatively lower temperature requires less laser energy to complete the lift-off. Laser lift-off process exposes a semiconductor surface for contact formation, enabling vertical LED fabrication, with n-contact and p-contact on the opposite sides of the light-emitting layer, respectively. Vertical LED can have more uniform current spreading therefore is more suitable for high power applications under high driving currents.

3. SUMMARY OF THE INVENTION

To overcome the above discussed deficiencies of prior art, the present invention provides a method for fabricating a vertical light emitting device, wherein the separation or lift-off of the substrate from the light emitting diode structure formed thereon is facilitated by forming voids at the interface between the substrate and the light emitting diode structure where the separation or lift-off occurs. The present invention also provides a substrate assembly for epitaxial growth of a light emitting diode structure thereon, wherein the substrate assembly contains a substrate and an epitaxial layer, and voids are formed at the interface between the substrate and the epitaxial layer in a controlled manner. A light emitting diode structure is then formed on the epitaxial layer, followed by attaching the light emitting diode structure to a superstrate, separating the substrate from the epitaxial layer, and forming a conductive layer and a contact pad in place of the substrate, so as to form a light emitting device.

One aspect of the present invention provides a method for fabricating a light emitting device. The method comprises: providing a substrate having depressions and epitaxial growth portions alternately formed on a top surface thereof; depositing an epitaxial layer on the top surface of the substrate to cover, but not fully fill, the depressions, so that voids are formed in the depressions; forming a light emitting diode structure over the epitaxial layer; attaching the light emitting diode structure to a superstrate; and separating the substrate from the epitaxial layer.

Another aspect of the present invention provides a substrate assembly for growing a light emitting diode structure thereon. The substrate assembly comprises: a substrate having depressions and epitaxial growth portions alternately formed on a top surface thereof; and an epitaxial layer formed on the top surface of the substrate, wherein the epitaxial layer covers, but does not fully fill, the depressions, so that voids are formed in the depressions.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention Like reference numbers in the figures refer to like elements throughout, and a layer can refer to a group of layers associated with the same function.

FIG. 3A illustrates the perspective view of a substrate according to an embodiment of the present invention.

5. DETAILED DESCRIPTION OF EMBODIMENTS

In the method of fabricating a vertical light emitting device according to one aspect of the present invention, to facilitate the separation or lift-off of a substrate from a light emitting diode structure formed thereon, voids are formed at or near the interface between the substrate and the light emitting diode structure where the separation or lift-off occurs. The voids can be in any suitable form, for example, isolated from each other, or connected and in fluid communication with each other. The size or cross-sectional dimension of the voids can be in the range from 0.5 to 5 µm for isolated and connected voids. The filling factor of the voids can be in the range of 1%-20% as defined below in this specification.

The voids at the interface between the substrate and the light emitting diode structure can be formed via a substrate assembly which contains a substrate and an epitaxial layer. The substrate is formed with depressions and epitaxial growth portions on its top surface with each of the epitaxial growth portions having an epitaxial growth surface. The growth of the epitaxial layer mainly starts from the epitaxial growth surfaces, not the depressions, and the epitaxial layer covers, but does not fully fill, the depressions so that voids are formed at the interface between the substrate and the epitaxial layer. The depressions and the epitaxial growth portions are alternately arranged on top surface of the substrate, so that the voids formed in the depressions can facilitate the separation or lift-off of neighboring epitaxial growth surfaces of the substrate from the epitaxial layer. The depressions can be formed in any shape and dimension, such as parallel grooves or network grooves, as long as suitable sized and shaped voids and desirable amount of voids can be formed therein. The depressions can have a cross-sectional width in the range of 0.5 µm-5 µm and a depth in the range of 1 µm-10 µm. The epitaxial growth surfaces are for the growth of the epitaxial layer thereon, and the size or cross-sectional width of the epitaxial growth surfaces can be in the range of 1 µm-10 µm.

Figure 1A:
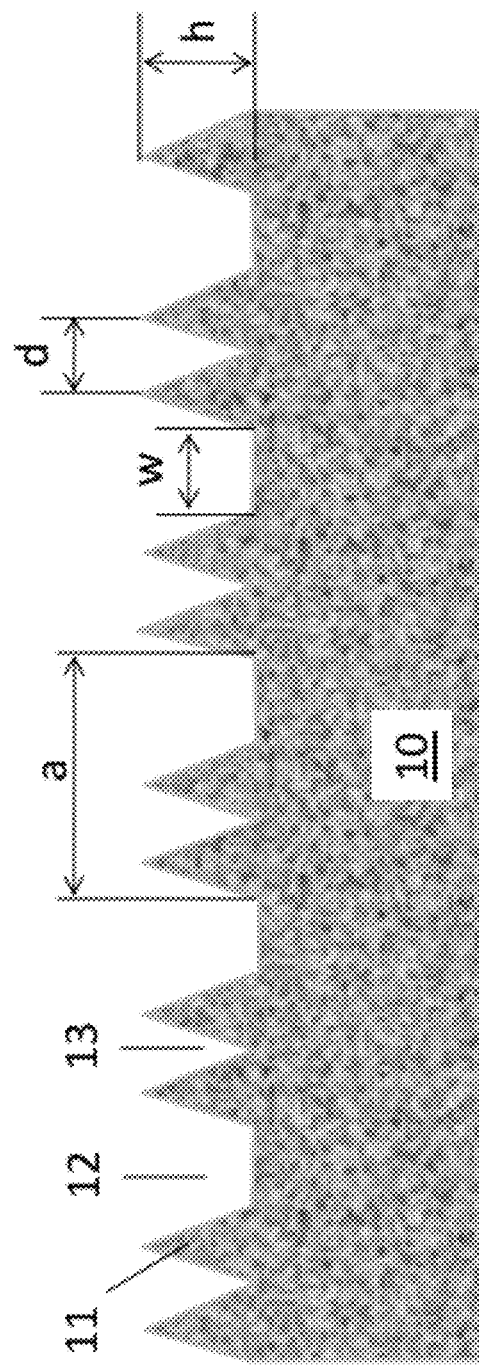
FIG. 1A illustrates the cross-sectional view of a substrate according to an embodiment of the present invention.
Figure 4:
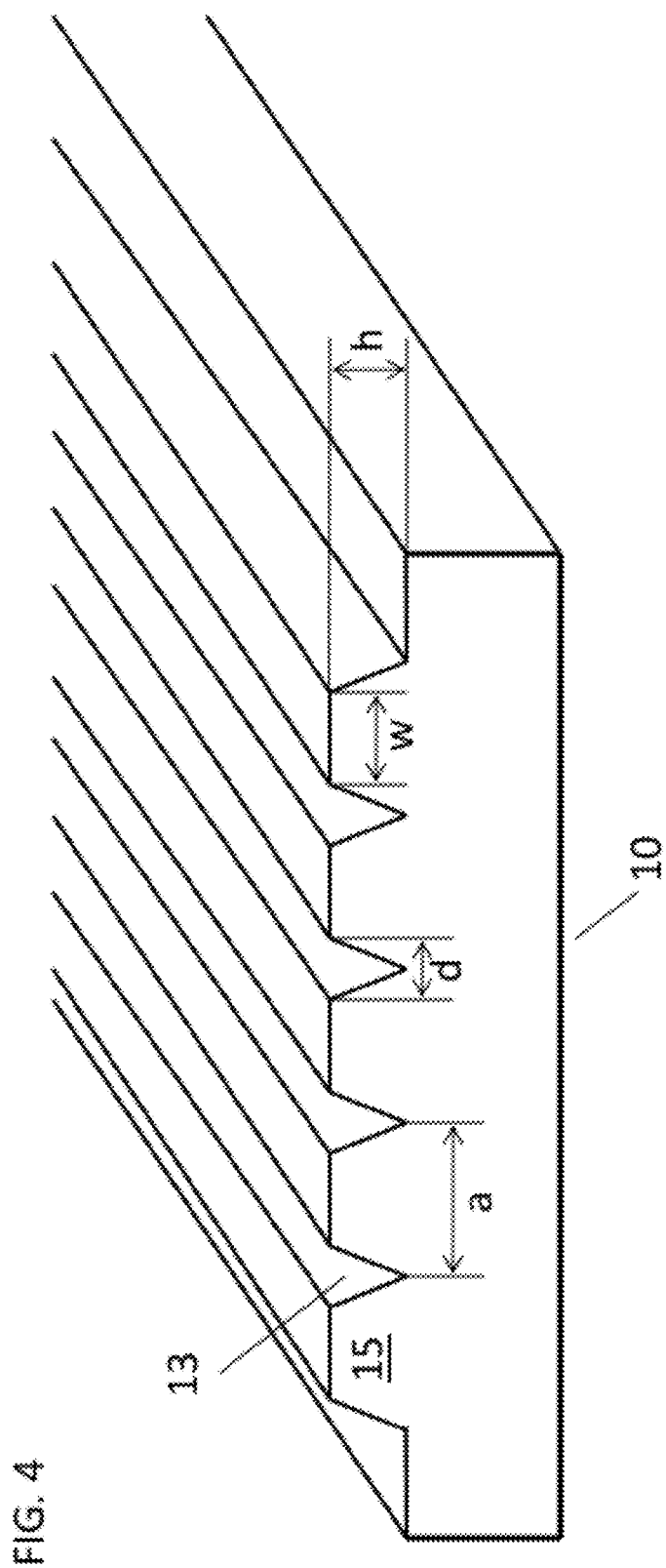
FIG. 4 illustrates the perspective view of a substrate according to an embodiment of the present invention.
Figure 5:
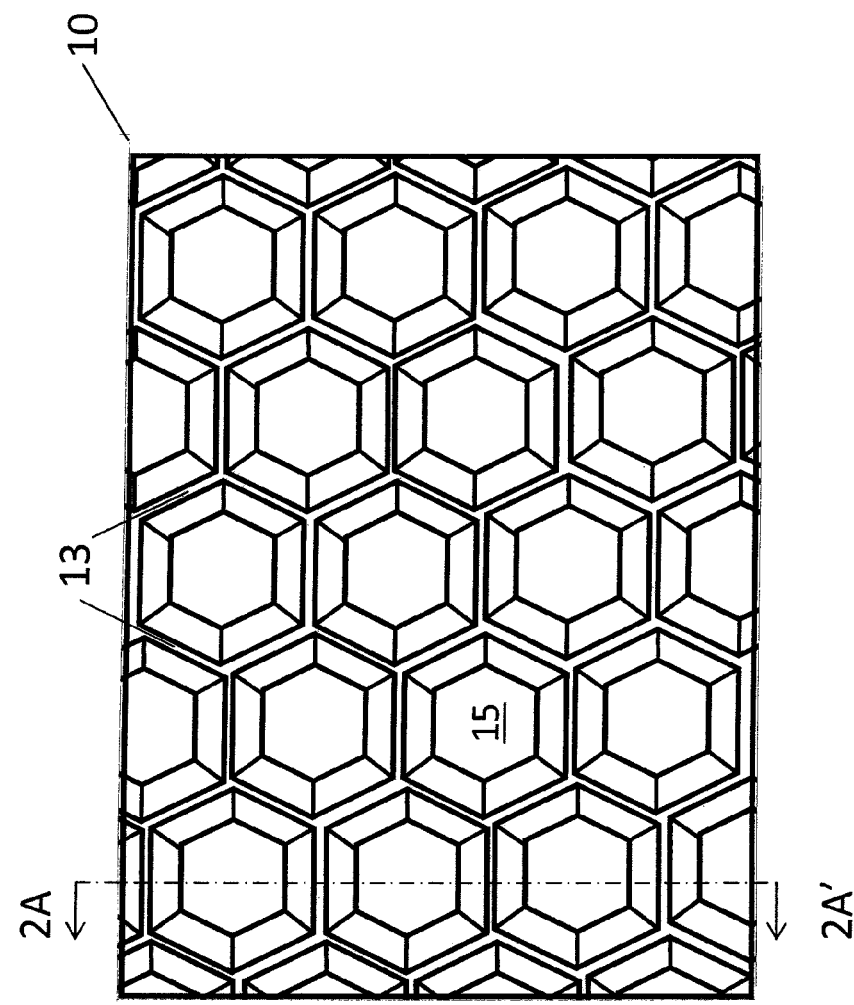
FIG. 5 illustrates the plane view of a substrate according to an embodiment of the present invention.

FIG. 1A illustrates the cross-sectional view of a substrate 10 for vertical LED growth according to one aspect of the present invention. Substrate 10 can be selected from sapphire, silicon, silicon carbide, gallium arsenide, spinel, and any other suitable materials. Two kinds of depressions are formed in substrate 10, depressions 12 with wider bottoms, such as flat bottoms as shown, to receive the following LED structure growth, and depressions 13 with narrower, sharp bottoms to form voids during the following LED structure growth. In the embodiment shown in FIG. 1A, each kind of depressions has its nearest or adjacent neighboring depressions belonging to the other kind of depressions. In other words, depressions 12 and 13 are preferably alternately arranged. The depressions can be formed in a periodic pattern, as shown in FIG. 1A, or a random pattern. When arranged in a periodic pattern, the pattern can be of one dimensional as shown in FIG. 3A, or two dimensional. Depressions 12 and 13 are defined by protrusions 11, respectively. Protrusions 11 also serve to separate depressions 12 from depressions 13. Shown in FIG. 1A and FIG. 3A, the depressions 12 and 13 are arranged in a periodic pattern, with a periodic constant a. The depth of depressions 13 can be less or greater than the depth of depressions 12. In FIG. 1A and FIG. 3A, the depths of depressions 12 and 13 are the same and equal to the height of protrusions 11. The nearest neighboring protrusions 11 are separated by a distance, d, measured from vertex to vertex of two neighboring protrusions 11 which define a depression 13. Generally, the distance d is the cross-sectional opening width at the top of a depression 13 as shown in FIGS. 3, 4, and 5. Referring to FIG. 1A, the cross-sectional bottom width of depressions 12 for receiving LED structure growth is w. The distance d can be in the range of 0.5 µm-5 µm, such as in the range of 1 µm-3 µm, while the cross-sectional bottom width w of depressions 12 can be in the range of 3 µm-10 µm, such as 5 µm-7.0 µm. The depth h of depressions 13 can be in the range of 1 µm-10 µm, such as 3 µm-6 µm. The periodic constant a can be in the range of 4 µm-20 µm, such as 7 µm-13 µm. In the embodiment shown in FIGS. 1A and 3, the depth, h, of depressions 13 is the same as that of depressions 12 and equal to the height of protrusions 11. In other embodiments, the depth of depressions 13 can be larger or smaller than the depth of depressions 12, and it is also possible that the depth of some depressions 13 is smaller than that of depressions 12 while the depth of other depressions 13 is larger than that of depressions 12. The depth of depressions 12 can be in the range of 1 µm-10 µm, such as 3 µm-6 µm.

In general, the selection rule of the dimension of the depressions 13 and 12, such as periodic constant a, cross-sectional bottom width w of depressions 12, depth h and cross-sectional width d at the top of depressions 13, is to make sure that depression 13 is sufficiently sharp so that there will be desired void's volume and void's density formed in places of depressions 13 upon the following LED structure growth, and to make sure that the LED structure can smoothly grow from the bottom of depressions 12. Therefore, depressions 12 here are also referred to as epitaxial growth portions with the bottom being the epitaxial growth surface. The aspect ratio (e.g., h/d) of depression 13 can be in the range of 1-5.

Substrate 10 with depressions 12 and 13 can be formed by standard lithography and etching process. For example, sapphire substrate 10 can be formed as follows. First, prepare a clean c-plane sapphire wafer for the deposition of a certain thickness, e.g., 200 nm, of silicon dioxide ($SiO_2$). Then a pre-determined pattern is transferred to the $SiO_2$ film and etch is performed to form $SiO_2$ masks parallel to c-plane sapphire's <1-1.0> direction. Thirdly, the wafer is immersed into hot acid solution such as $H_2SiO_4$. Heating the acid solution up to 260° C.-330° C. can result in an etch rate of sapphire up to 3 µm/min. For such a high etch rate, in order to avoid insoluble such as $Al_2SO_4$ formation, another acid, usually $H_3PO_4$ is added to the etchant. The volume ratio of the preferred etchant is 3:1 for $H_2SiO_4$: $H_3PO_4$. Depending on the acid mixture temperature so the etching rate, facets (11.l) are formed to define depressions 12 and 13. (11.l) facets compared to the basal plane (00.1) are of higher surface energy therefore are non-stable growth planes.

Figure 3B:
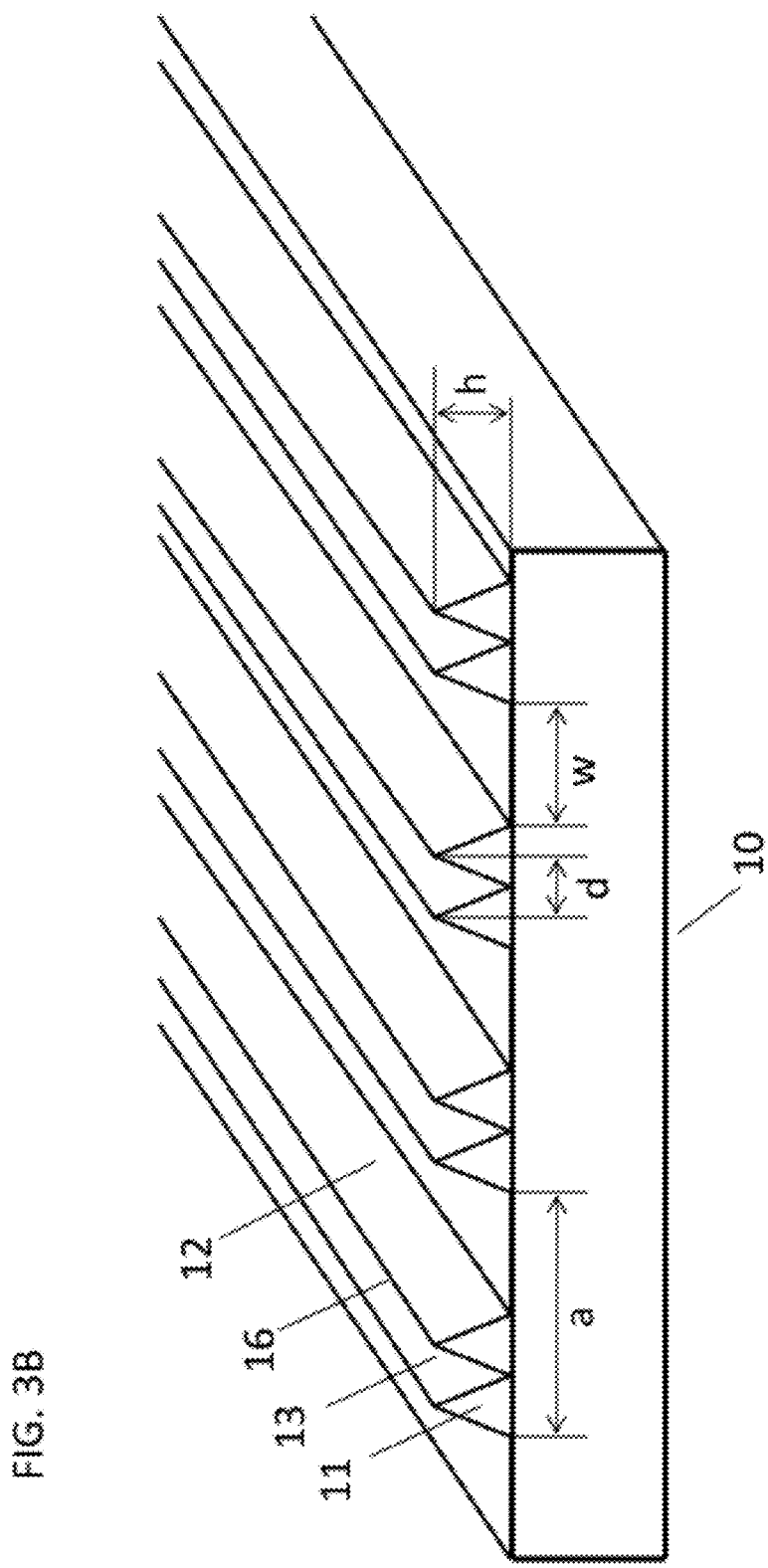
FIG. 3B illustrates the perspective view of a substrate according to another embodiment of the present invention.

Substrate 10 with depressions 12 and 13 can also be formed with depositing a material layer and forming depressions 12 and 13 in the deposited material layer, as shown in FIG. 3B. In this case, substrate 10 comprises an underneath substrate and a layer 16 deposited on the underneath substrate. The underneath substrate can be made of the same material as the single substrate 10 without layer 16 discussed above. The only difference between the structures shown in FIG. 3A and FIG. 3B is that there is an additional layer 16 and depressions 12 and 13 are formed in layer 16 in the structure of FIG. 3B. The deposited material layer 16 is preferably to be transparent to visible light, and have refractive index in-between that of layer 20 such as GaN and the underneath substrate such as sapphire. Also, material 16 is preferably to be thermal stable and can sustain a high temperature of 1000-1100° C. With these merits being said, the preferred material for material layer 16 is silicon nitride. The substrate 10 shown in FIG. 3B can be formed as follows. First, material layer 16 of thickness h is deposited on a sapphire underneath substrate or other suitable underneath substrate. Then a pattern-pre-determined protection mask, such as made of metal Cr, is formed over the top surface of material layer 16. Thirdly, dry etching (ion-coupled plasma) or other suitable etching method is performed to etch material layer 16 to form depressions 12 and 13, which are defined by protrusions 11. In FIG. 3B, protrusions 11 are made of material layer 16, and the bottom plane of depressions 12 is used for epitaxial growth so that it is exposed to the surface of the underneath substrate such as a sapphire substrate. The pattern shown in FIG. 3B is preferably parallel to c-plane sapphire's <1-1.0> direction. Other patterns of depressions 13 and/or 12 as discussed in this specification can also be made when using layer 16.

The as-formed substrate 10 is loaded into any suitable epitaxial growth reactor, such as metalorganic chemical vapor deposition (MOCVD), molecular beam epitaxy (MBE), and hydride vapor epitaxy (HVPE) reactors, for the following LED structure growth. In an embodiment, depressions 13 are formed without any stable growth plane therein, while depressions 12 have only one stable growth plane, which is the flat bottom plane of depressions 12. A stable growth plane usually has lower Miller index than that of the non-stable growth plane. For example, if substrate 10 is made of sapphire, then the flat bottom plane of depressions 12 is preferred to be (00.1) plane, while the other inclined sidewall surfaces of the depressions 12 can be a higher Miller index plane such as (11.2), (11.3), (10.2), (10.3) and the like.

Figure 1B:
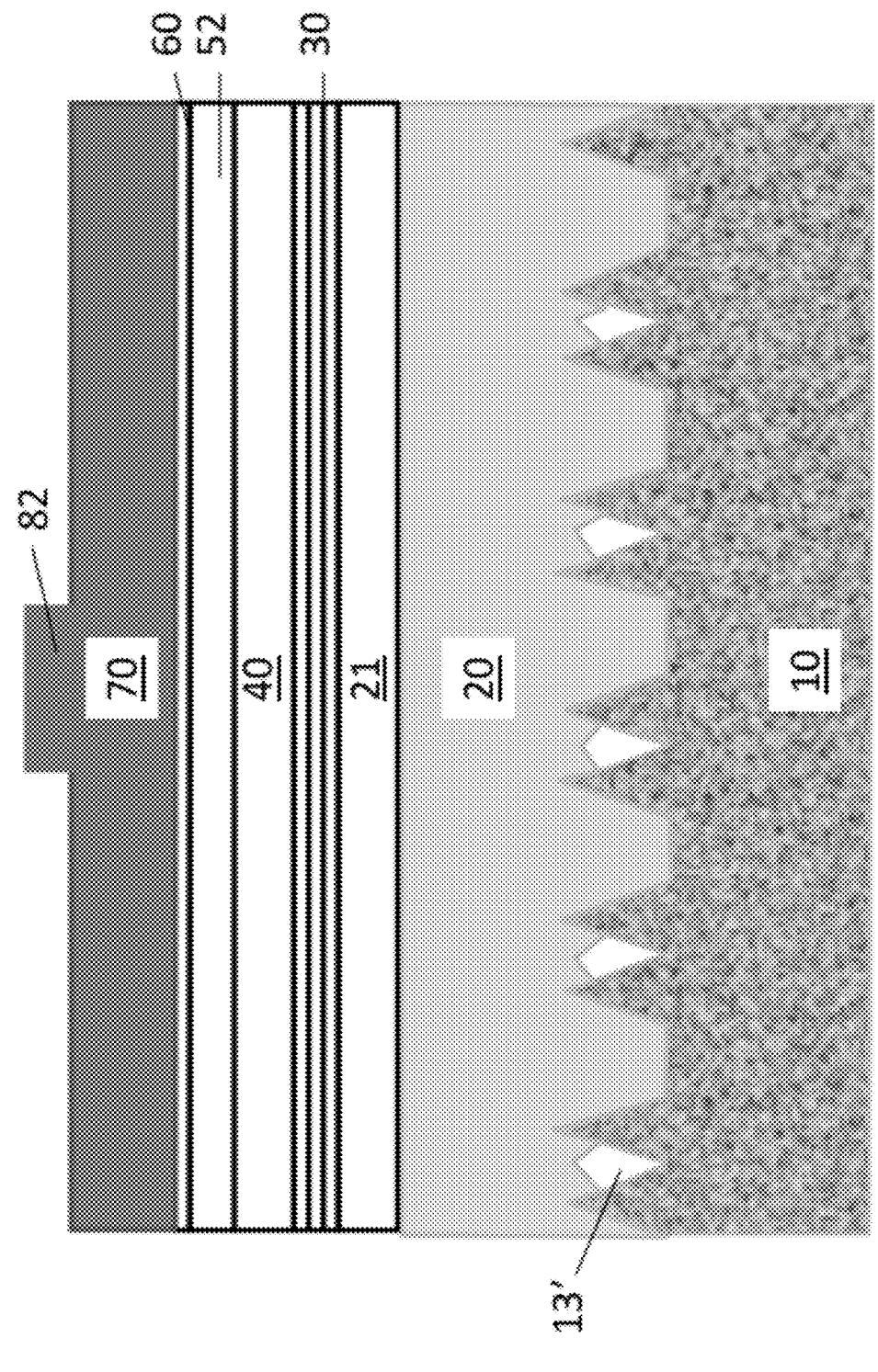
FIG. 1B illustrates the cross-sectional view of an LED structure deposited on a substrate according to an embodiment of the present invention.

The selection of stable and non-stable growth planes leads to epitaxial growth mainly or even only starting from the bottom plane of depressions 12. As shown in FIG. 1B, after a certain thickness of epitaxial growth of layer 20, epitaxial layer 20 has a flat top surface for the following LED structure growth. Voids 13' in depressions 13 are formed at bottom portion of depressions 13 at the interface between layer 20 and substrate 10.

In order to facilitate voids 13' formation, enhanced three-dimensional growth is preferred at the beginning. Three-dimensional growth mode can enlarge the void's volume of voids 13. This means that at the beginning of the growth of layer 20, a higher growth pressure, higher V/III ratio, and lower growth temperature are preferred. For example, during the voids formation process, the growth pressure can be from 500-760 torr, growth temperature can be from 950-1000° C., and the V/III ratio can be from 4000-8000. Upon the formation of voids 13, the growth pressure can be lowered to 200-500 torr, growth temperature can be increased to 1000-1080° C., and the V/III ratio (i.e., the molar fraction ratio of group V sources over group III sources) can be reduced to 2000-4000. Layer 20 can be made of silicon-doped GaN or other suitable materials such as silicon doped InGaN and AlGaN. Voids 13' can exist in isolated state in which voids 13' do not connect to each other, or in a connected state in which voids 13' are connected to each other. For example, in the embodiment shown in FIGS. 1B and 3, depressions 13 are formed as parallel grooves and, after the deposition of layer 20 thereon, voids 13' are formed and connected to each other in at least some of the grooves, and the connected voids 13' in a groove are in fluid communication with each other and with outside environment. In case of isolated voids 13', the dimension or size of voids 13' can be in, but not limited to, the range from 0.5 to 5 µm, such as from 1 to 3 µm, and the sheet density of voids 13', which is defined as the number of voids 13' per unit area in a plane cut through the interface where voids 13' are formed, can be in, but not limited to, the range of $10^4$-$10^7$ $cm^{-2}$, such as $10^5$-$10^6$ $cm^{-2}$. In case of connected voids 13', the cross-sectional dimension of voids 13', i.e., the largest cross length of the cross-section in the direction perpendicular to the longitudinal axis of the connected voids 13', can be in, but not limited to, the range from 0.5 to 5 µm, such as from 1 to 3 µm, and the line density of the connected voids 13', i.e., the number of grooves of depressions 13 per unit length, can be in, but not limited to, the range of $10^3$-$10^4$ $cm^{-1}$. The void filling factor can be in the range of 1%-20%, such as 5%-10%. The void filling factor as used here is defined as the ratio between total void volume and the total volume of h×A, where A is the total planar surface area of the substrate, h is the depth of depressions 13.

Formed over layer 20 is a lower confining layer 21 for the light-emitting layer 30. Layer 21 can be selected from silicon-doped GaN, InGaN, and AlGaN. Light-emitting layer 30 is an indium-containing structure to give the desired light emission. It can be a single InGaN layer or a GaN/InGaN multiple quantum well. Following light-emitting layer 30 is an upper confining layer 40, which can be made of Mg-doped GaN, InGaN, or AlGaN. Any other suitable LED structures can be formed over layer 20.

After the epitaxial growth of upper confining layer 40, a current spreading layer 52 and a reflector 60 are formed over the LED structure on substrate 10, where the LED structure includes lower confining layer 21, light-emitting layer 30, and upper confining layer 40 in the embodiment shown in FIG. 1B. In an embodiment, after the epitaxial growth of upper confining layer 40, substrate 10 with the LED structure is removed from the epitaxial reactor and the formation of the current spreading layer 52 and the reflector 60 is conducted in respective vapor deposition system such as electron-beam deposition chamber. Referring to FIG. 1B, a transparent conductive layer 52, such as a p-type current spreading layer, for current spreading is formed over the upper confining layer 40. Layer 52 can be a transparent metallic layer such as Ni/Au, NiO/Au, or a transparent conductive oxide layer such as zinc oxide (ZnO), indium tin oxide (ITO). Layer 52 can be a single layer or multiple layers. Over the transparent conductive layer 52 is the conductive reflector/mirror 60, which can be made of silver (Ag), aluminum (Al), or metallic layers like zirconium nitride (ZrN) and hafnium nitride (HfN). Working together with layer 52, reflector/mirror 60 is preferably to have a reflectivity in the visible spectrum region above 90%.

Substrate 10 with the LED structure, the current spreading layer 52 and the reflector 60 is then attached to a supporting superstrate 70 of exceptional thermal and electric conductivity. The attachment can be done via known methods such as wafer bonding, or electrolytic plating. Materials to make superstrate 70 can be selected from Cu, Pt, Pd, Ni, Ag, Au, Al, Co, W, Mo, Si, and their alloy. The material of superstrate 70 is preferred to be Cu or Cu alloy, considering its exceptional thermal and electric properties and commercial viability. Finally, a contact pad 82, such as a p-contact pad, is formed over the superstrate 70.

Figure 1C:
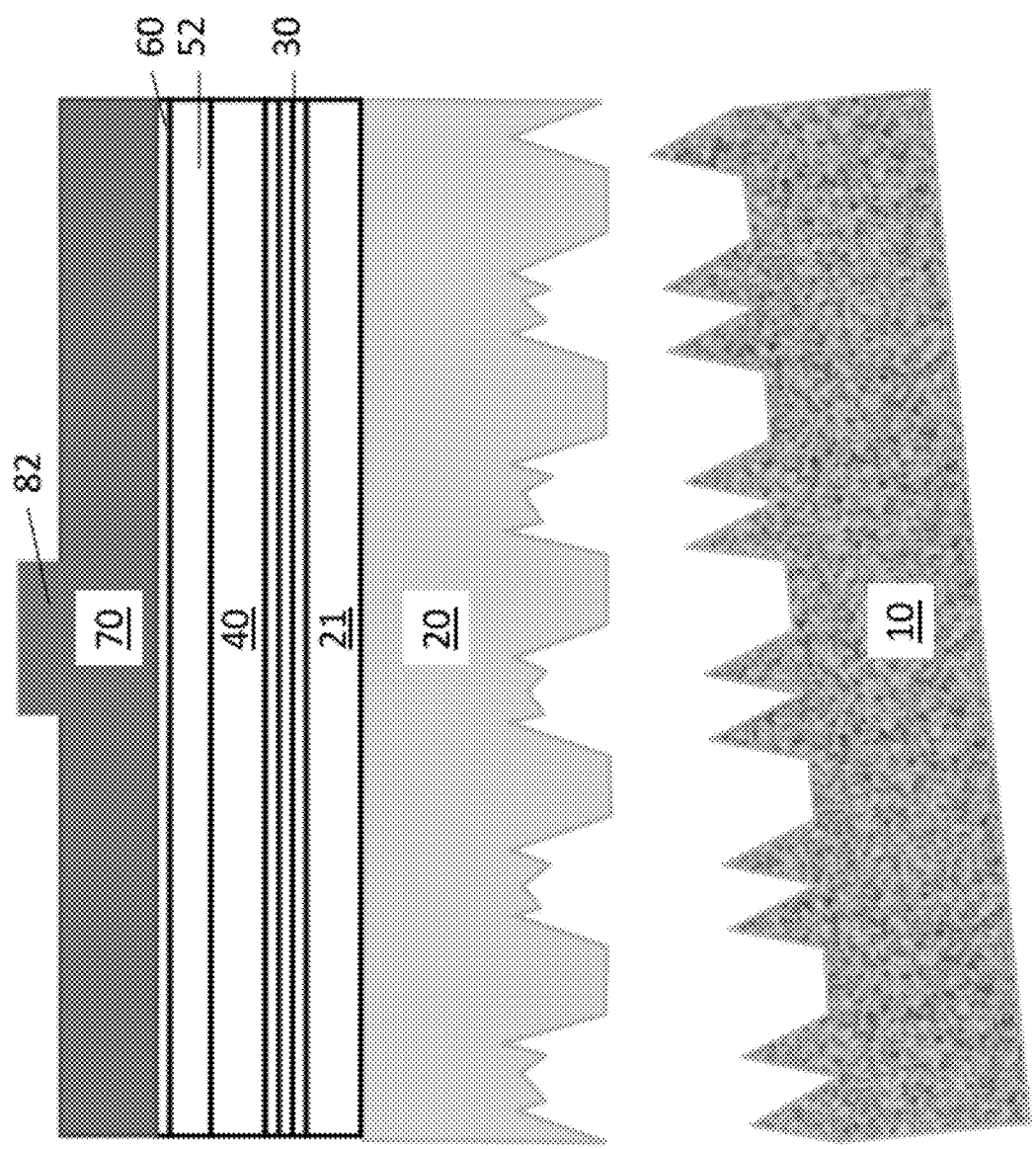
FIG. 1C illustrates separation of the LED structure from the substrate shown in FIG. 1B.

A separation mechanism is applied to a structure such as that shown in FIG. 1B to remove the original substrate 10, as illustrated in FIG. 1C. The separation mechanism can be mechanical lapping and polishing, chemical etching, and laser lift-off. In the case of chemical etching, referring to FIG. 1B and FIG. 3, chemical agents can be introduced via capillary action into connected voids 13' at the interface between epitaxial layer 20 and substrate 10 to speed up the separation process. For example, in the embodiment of GaN-based LEDs grown on silicon substrate, an oxidizing agent, such as $HNO_3$, $H_2O_2$, and an etching agent, such as HF, can be presented in voids 13' at the GaN/Si interface via capillary action. Therefore, chemical etching of Si protrusions 11 can result in the epilayer-substrate (e.g., layer 20 and substrate 10 in the embodiment shown in FIG. 1B) separation, instead of etching the whole piece of substrate 10.

Still referring to FIG. 1B and FIG. 3, in one embodiment of the present invention, substrate 10 is (111) silicon, wherein the voids 13' is along <1-10> or equivalent directions.

Figure 6:
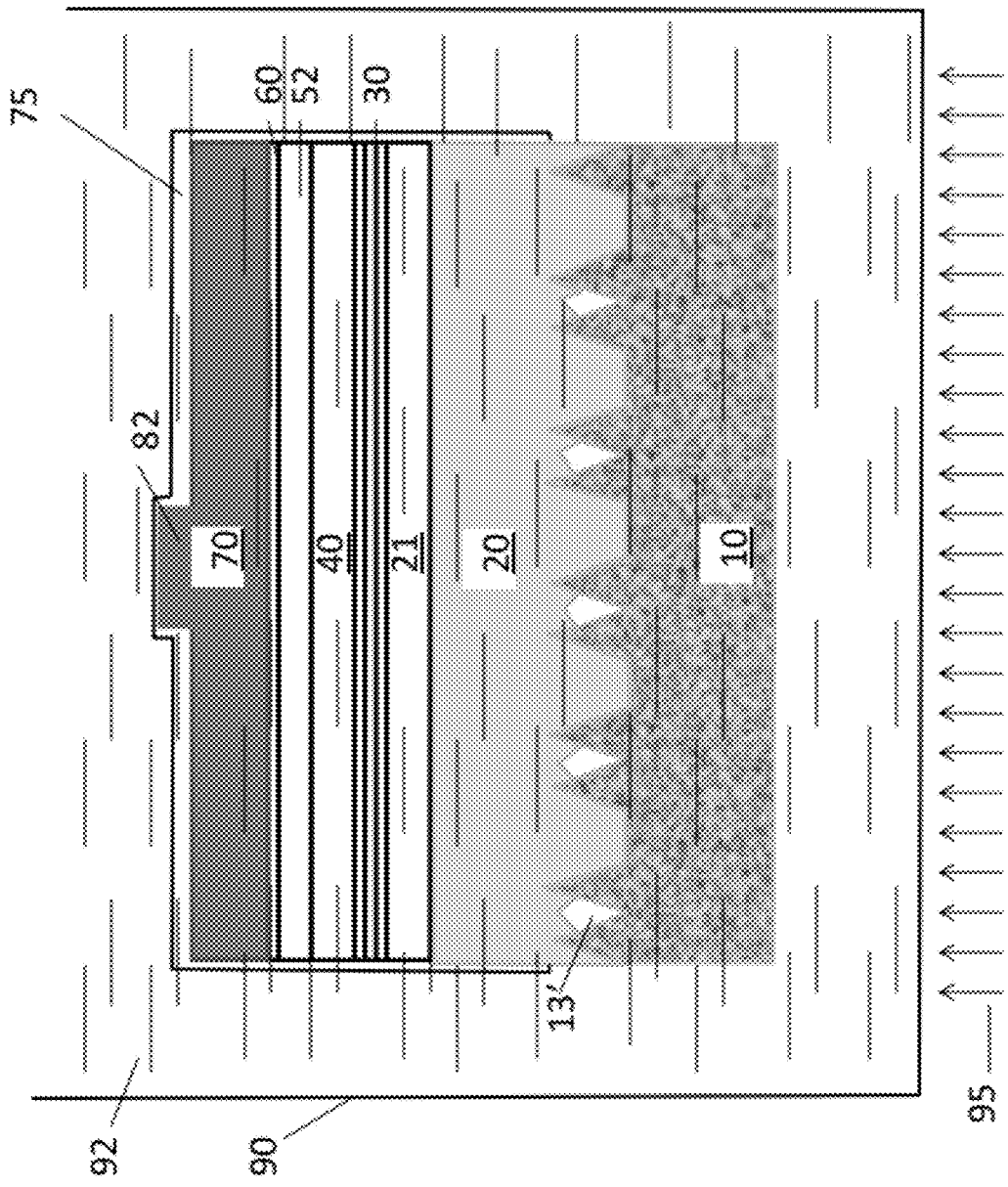
FIG. 6 illustrates a method to separate the LED structure and substrate according to one aspect of the present invention.

In an embodiment of GaN-base LEDs grown on a sapphire substrate, substrate 10 can be (00.1) sapphire, and voids 13' can be formed in <11.0>, <10.0> or equivalent directions. Referring to FIG. 6, a light-emitting structure such as that shown in FIG. 1B is protected by a passivation layer 75, which covers the top surface of the light-emitting structure, and can also cover a part of the sidewall of the light-emitting structure, but exposing the voids 13' on two sidewalls. Passivation layer 75 can be made of silicon nitride or photo-resist. The light-emitting structure is then immersed into aqueous chemical etchant 92 in a container 90. Substrate 10 is exposed to receive UV light 95 coming from outside the bottom of container 90. Chemical etchant 92 can be alkali such as NaOH, KOH, or acid such as $HNO_3$, $H_2O_2$ and HF. Upon capillary action, chemical etchant 92 will be presented in connected voids 13' to etch the interface area between layer 20 and substrate 10. The etching process can be greatly enhanced via shining UV light 95. In this embodiment, the epilayer-substrate separation has significantly reduced or no negative effect on light-emitting layer 30.

In another embodiment of a GaN-based LED structure grown on a sapphire substrate, the epilayer-substrate separation can be achieved via laser lift-off. A high-energy laser beam, for example, a 248 nm excimer laser beam is shone at the GaN-sapphire interface through sapphire substrate. Voids 13' shown in FIG. 1B can absorb shockwaves from the high-pressure nitrogen gas produced by GaN dissociation, obviating or alleviating damages to the light-emitting structure from the shockwaves.

Figure 1D:
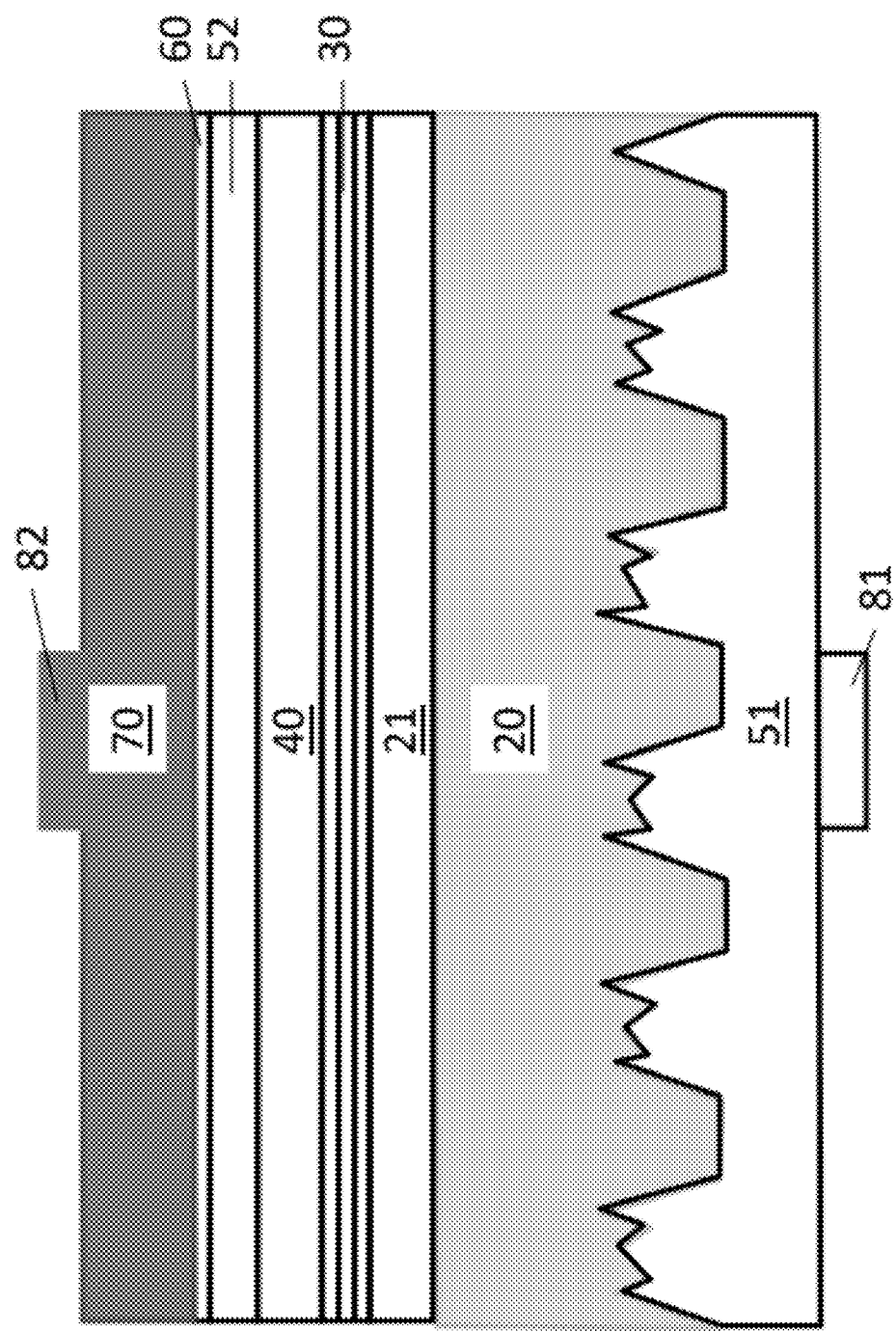
FIG. 1D illustrates the cross-sectional view of a vertical LED according to an embodiment of the present invention.
Figure 1E:
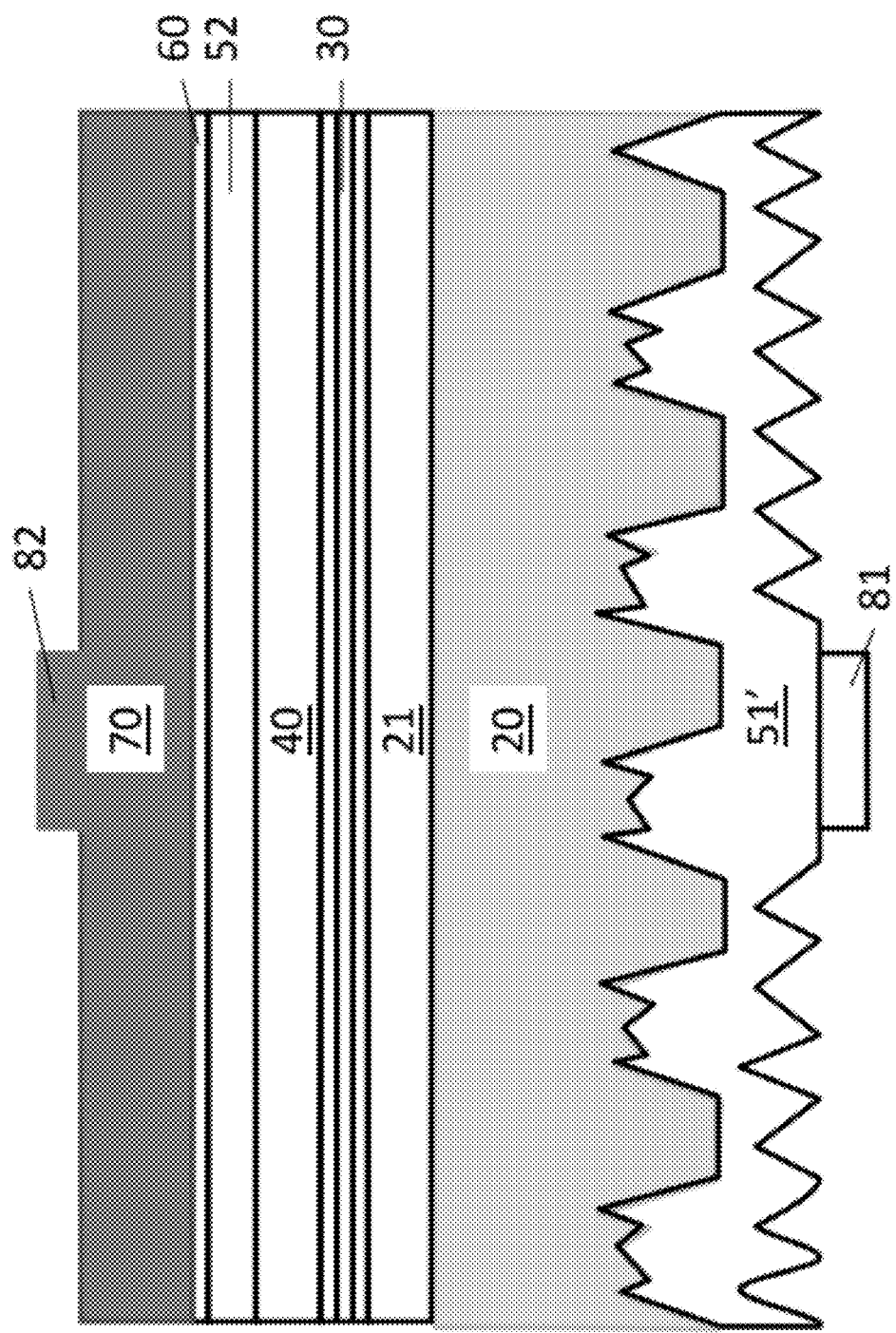
FIG. 1E illustrates the cross-sectional view of a vertical LED according to an embodiment of the present invention.

Still referring to FIG. 1C, upon separation, layer 20 has a roughened or patterned surface which can benefit light extraction for the light-emitting structure. Or, as shown in FIG. 1D, layer 20 can be further planarized by a transparent conductive layer 51. Layer 51 can also be textured or roughened into layer 51' for improved light extraction efficiency, as shown in FIG. 1E. On top of layer 51 (51') is an n-type contact pad 81. Transparent conductive layer 51 (51') can be a transparent metallic layer such as Ni/Au, NiO/Au, or a transparent conductive oxide layer such as ZnO, ITO, and can be a single layer or multiple layers.

In the foregoing description the LED structure starts from the substrate with n-type layer first. It is understood that the LED structure can also starts from the substrate with p-type layer first. This means that in other embodiments, layers 20, 21 can be of p-type and layers 40, 52 can be of n-type.

FIGS. 2A-2D illustrate the fabrication of a vertical LED according to another embodiment of the present invention.

Figure 2A:
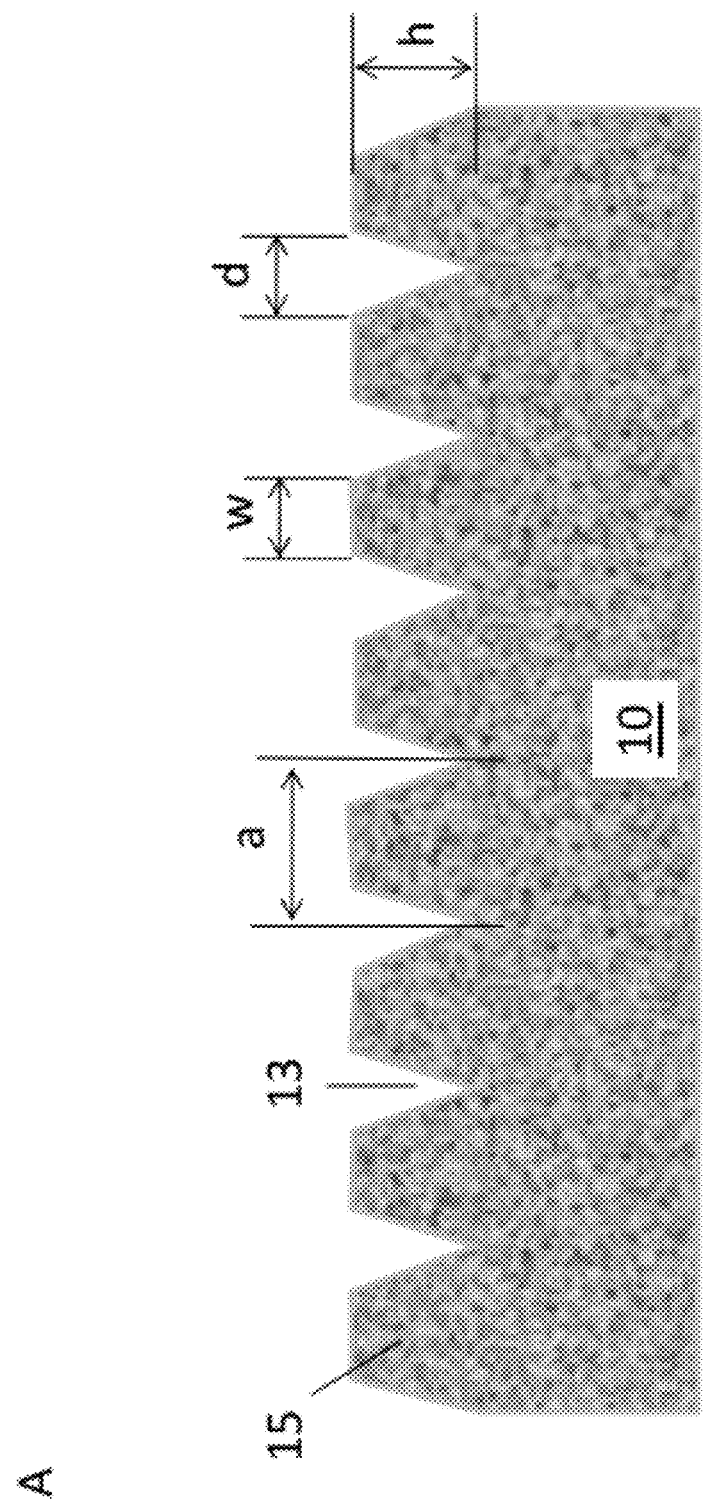
FIG. 2A illustrates the cross-sectional view of a substrate according to an embodiment of the present invention.

FIG. 2A illustrates the cross-sectional view of a substrate 10 according to another embodiment of the present invention. Substrate 10 can be selected from sapphire, silicon, silicon carbide, gallium arsenide, and spinel. The top surface of substrate 10 contains epitaxial growth portions 15 and depressions 13. Depressions 13 are formed via lithography and etching, having inclined sidewalls which are non-stable-crystal-growth planes. As shown in FIG. 2A, depressions 13 have a V-shaped cross-section. Epitaxial growth portions 15 have a flat top surface to receive epitaxial growth of an LED structure. In the embodiment shown in FIG. 2A, each epitaxial growth portion 15 is separated from other epitaxial growth portions 15 by neighboring depressions 13, and each depression 13 is separated from other depressions 13 by neighboring epitaxial growth portions 15. However, the structural relationship of epitaxial growth portions 15 and depressions 13 is not limited to that shown in FIG. 2A. Epitaxial growth portions 15 and depressions 13 can be formed in a periodic pattern, as shown in FIG. 2A, or a random pattern. When arranged in a periodic pattern, the pattern can be of one dimensional, as shown in FIG. 4 (FIG. 2A is a cross-sectional view of FIG. 4), or two dimensional as shown in FIG. 5 (FIG. 2A is also a cross-sectional view long 2A-2A' direction of FIG. 5).

Shown in FIG. 2A and FIG. 4, epitaxial growth portions 15 and depressions 13 are arranged in a periodic pattern, with a periodic constant a, and depressions 13 have a cross-sectional width, d, at the top. The depth, h, of depressions 13 is equal to the height of epitaxial growth portions 15. Referring to FIG. 2A, the cross-sectional width, w, of the top surface of epitaxial growth portions 15 is (a-d), the top surface of epitaxial growth portions 15 is for receiving LED structure epitaxial growth. The cross-sectional width d of depressions 13 can be in the range of 0.5 µm-5 µm, for example 1 µm-3 µm, while the cross-sectional width w of the top surface of epitaxial growth portions 15 can be in the range of 1 µm-10 µm, such as 4 µm-7 µm. The depth h of depressions 13 can be in the range of 1 µm-10 µm, such as 3 µm-6 µm.

FIG. 5 illustrates the plane view of a two-dimensional pattern of epitaxial growth portions 15 and depressions 13. FIG. 2A is a cross-sectional view along line 2A-2A' of FIG. 5. Epitaxial growth portions 15 are hexagonally shaped and are arranged on the surface of substrate 10 in a close-packed hexagonal pattern. The inclined sidewalls of neighboring epitaxial growth portions 15 define depressions 13. The dimensions of parameters h, d, w, and a as shown in FIGS. 2 and 5 have similar values as that discussed above in connection with FIGS. 2 and 4. The epitaxial growth portions 15 can also be made with any other shape of a relatively smaller upper surface, a larger base and an inclined sidewall connecting the upper surface and the base. The upper surface is for epitaxial growth of an epitaxial layer, while the inclined sidewalls of neighboring epitaxial portions 15 define depressions 13. For example, epitaxial portions 15 can be made of truncated cone shape. The upper surface of epitaxial portions 15 can be made of a triangular, square, rectangular, or other polygonal shape, while the base of corresponding epitaxial portions 15 can be made triangular, square, rectangular, or other polygonal shape, respectively.

In general, the selection rule of a, d, w, and h is to make sure that depressions 13 are sufficiently sharp so that there will be desired void's volume and density formed in depressions 13 upon the following LED structure growth, and to make sure that the LED structure can smoothly grow from the top surface of epitaxial growth portions 15. The aspect ratio (e.g., h/d) of depression 13 can be in the range of 1-5.

Substrate 10 can be formed by standard lithography and etching process. The as-formed substrate 10 is loaded into any suitable epitaxial growth reactor, such as metalorganic chemical vapor deposition (MOCVD), molecular beam epitaxy (MBE), and hydride vapor epitaxy (HVPE) reactors, for the following LED structure growth. Depressions 13 are formed without any stable growth plane. A stable growth plane usually has lower Miller index than that of the non-stable growth plane. For example, if substrate 10 is made of sapphire, then the flat top surface of epitaxial growth portions 15 is preferred to be (00.1) plane, while the other inclined planes defining depressions 13 can be a high Miller index plane such as (11.2), (11.3), (10.2), (10.3) and the like.

Figure 2B:
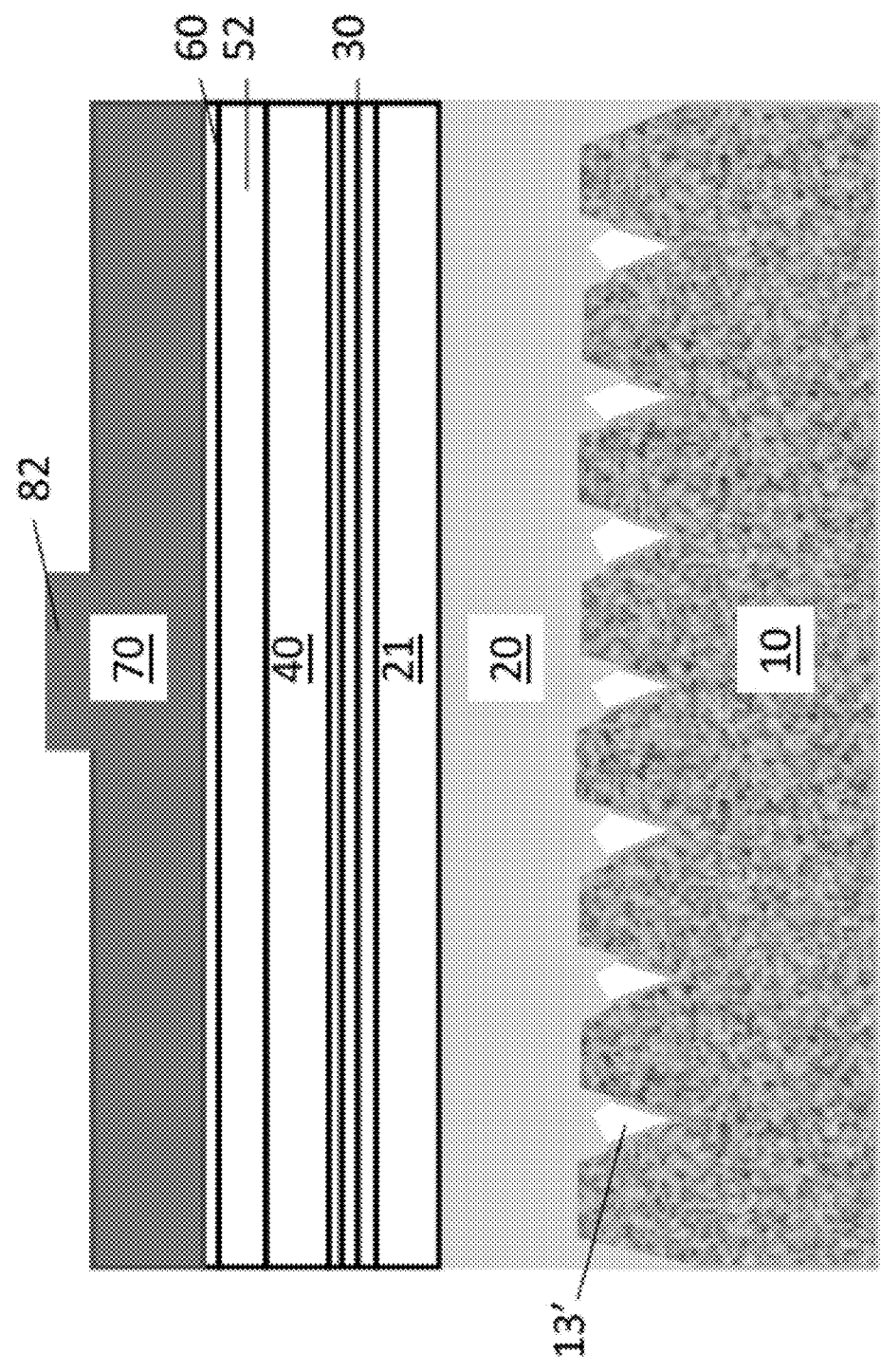
FIG. 2B illustrates the cross-sectional view of an LED structure deposited on a substrate according to an embodiment of the present invention.

The selection of stable and non-stable growth planes leads to epitaxial growth mainly or even only starting from the top surface of epitaxial growth portions 15. As shown in FIG. 2B, after a certain thickness of epitaxial growth of layer 20, which may comprise silicon-doped GaN, a flat surface of layer 20 is achieved for the following LED structure growth. Meanwhile, voids 13' are formed at bottom portion of depressions 13 at the interface between layer 20 and substrate 10 via the proper selection of stable and non-stable planes, and parameters h, d, and w as mentioned above. In the embodiment shown in FIGS. 2A and 4, depressions 13 are formed as parallel grooves and, after the deposition of layer 20 thereon, voids 13' are formed and connected to each other in at least some of the grooves and the connected voids 13' in a groove are in fluid communication with each other and with outside environment. In the embodiment shown in FIGS. 2A and 5, depressions 13 are defined by sidewalls of neighboring hexagonally shaped epitaxial portions 15, forming interconnected network grooves and, after the deposition of layer 20 thereon, voids 13' are formed and connected to each other in at least some of the network grooves and the connected voids 13' in the network grooves are in fluid communication with each other and with outside environment. In the embodiment as shown in FIG. 5, the cross-sectional dimension of voids 13' i.e., the largest cross length of the cross-section in the direction perpendicular to the longitudinal axis of the connected voids 13' in a network groove of depressions 13, can be in, but not limited to, the range from 0.5 to 5 μm, such as from 1 to 3 μm. The void filling factor can be in the range of 1%-20%, such as 5%-10%.

Layers 21, 30, 40, 52 and 60, supporting superstrate 70, and p-contact pad 82 are the same as those shown and discussed in connection with FIG. 1B and are deposited over layer 20 and substrate 10 in a similar manner to produce the LED structure shown in FIG. 2B. Therefore, no further discussions will be given here.

Figure 2C:
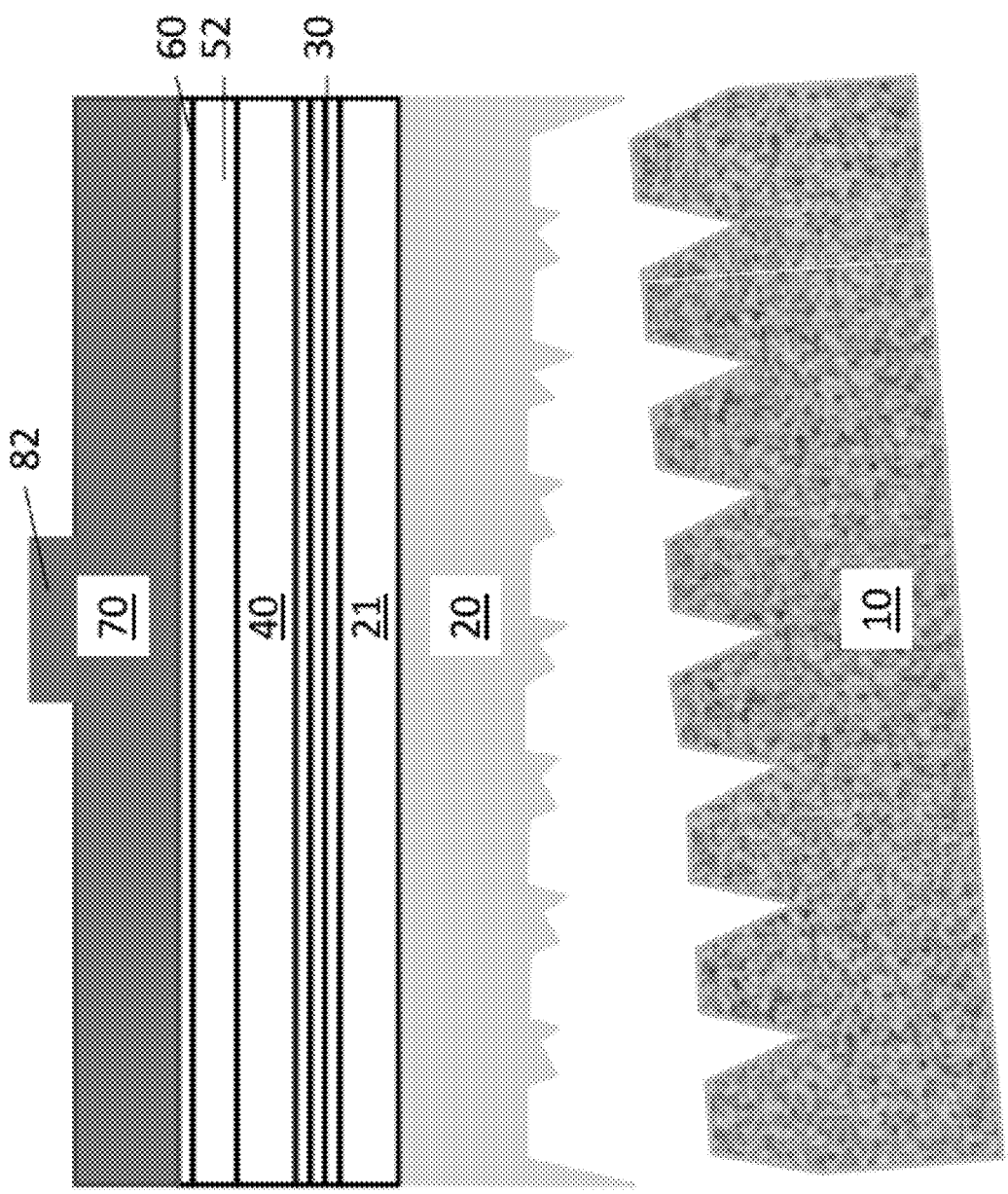
FIG. 2C illustrates separation of the LED structure from the substrate shown in FIG. 2B.

A separation mechanism is applied to the structure of FIG. 2B to remove the original substrate 10, as illustrated in FIG. 2C. The separation mechanism can be mechanical lapping and polishing, chemical etching, and laser lift-off, similar to those previously discussed in connection with FIGS. 1B and 1C. Therefore, no further discussion is given here.

Figure 2D:
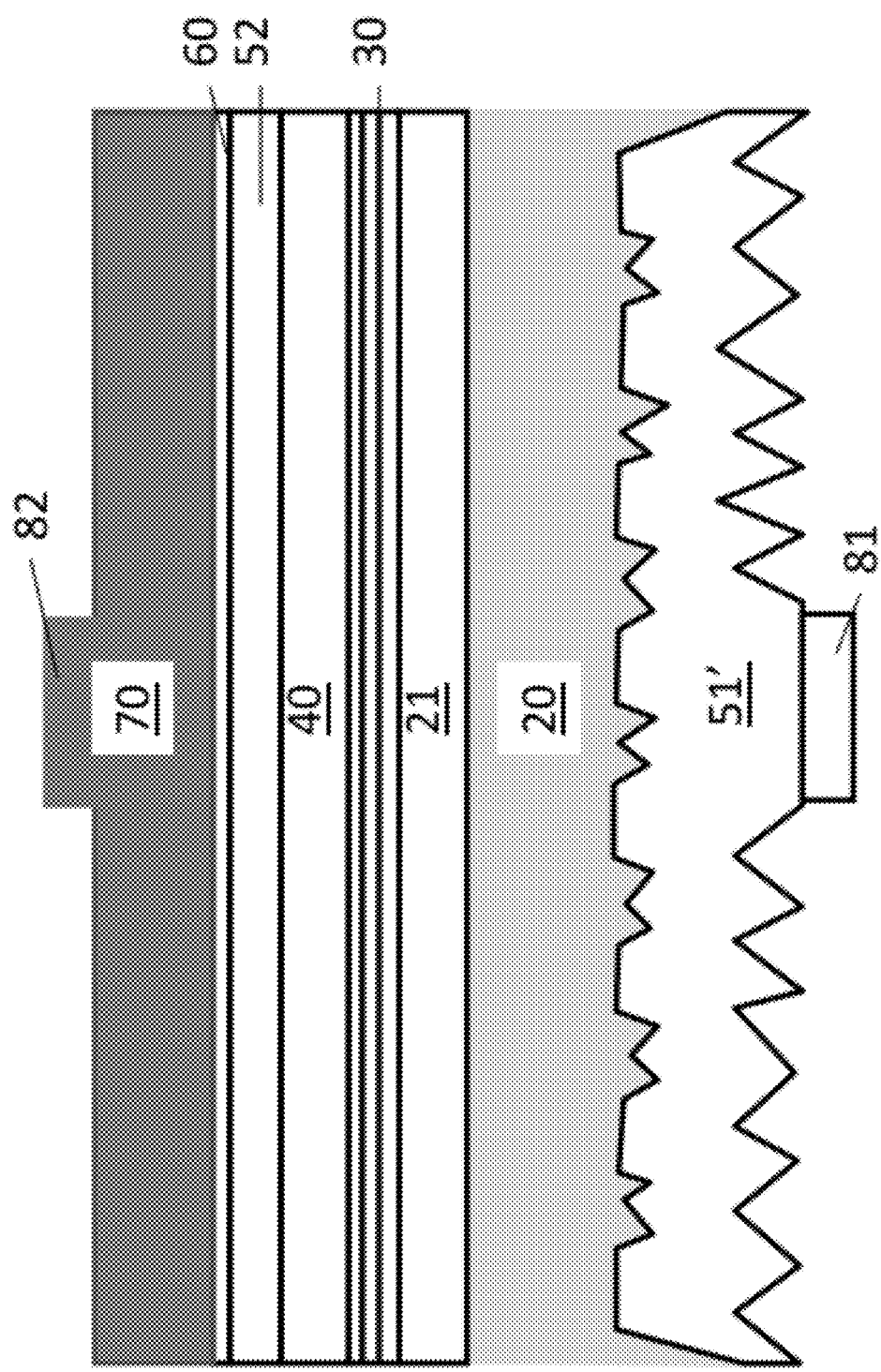
FIG. 2D illustrates the cross-sectional view of a vertical LED according to an embodiment of the present invention.

Still referring to FIG. 2C, upon separation, layer 20 has a roughened or patterned surface which can benefit light extraction for the light-emitting structure. Or, as shown in FIG. 2D, layer 20 can be further planarized by a transparent conductive layer. This transparent conductive layer can have a planar surface, also can be textured or roughened into layer 51' for improved light extraction efficiency. On top of transparent conductive layer 51' is an n-type contact pad 81. Transparent conductive layer 51' can be a transparent metallic layer such as Ni/Au, NiO/Au, or a transparent conductive oxide layer such as ZnO, ITO, and can be a single layer or multiple layers.

Figure 7:
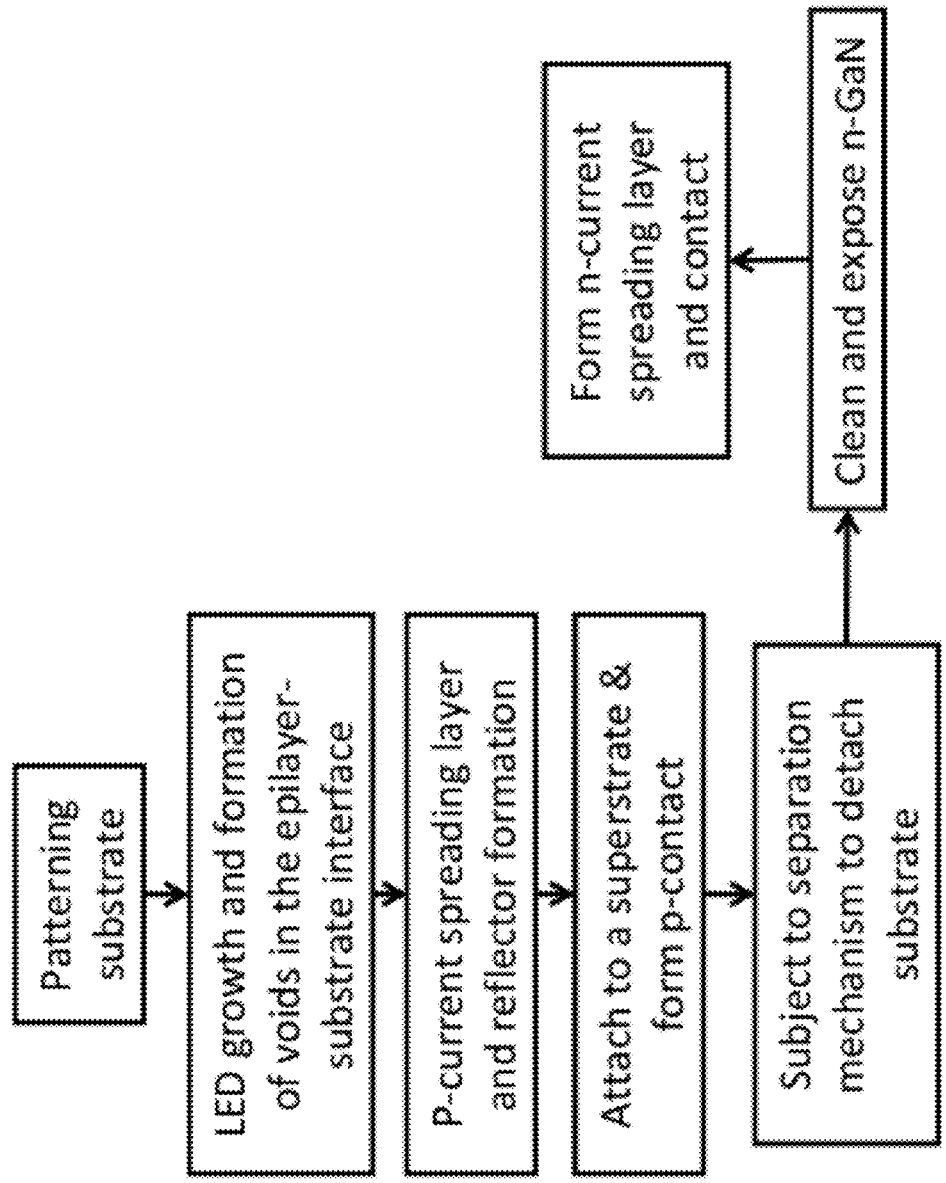
FIG. 7 shows the fabrication process flow chart of a vertical LED according to an embodiment of the present invention.

FIG. 7 illustrates a fabrication flow chart summarizing the fabrication process of a vertical LED according to an embodiment of the present invention. It starts with patterning the substrate, with optimized patterns selection to achieve the desired void volume and void density at the epilayer-substrate interface in later LED structure growth process. Then an LED structure comprising an upper confining layer, a light-emitting layer, a lower confining layer, and an epitaxial layer is formed on the patterned substrate with the epitaxial layer being in contact with the patterned substrate, and growth parameters of the epitaxial layer are optimized to have voids generation at the epilayer-substrate interface. The LED structure grown on the patterned substrate is then coated with a p-type transparent conductive layer and a minor thereon. Next step is to attach the LED structure to a thermally and electrically advantageous superstrate, which also provides mechanical support for the LED structure upon the separation from the original substrate. This attaching step is done by attaching the superstrate to the side opposite to the substrate of the LED structure via known method in the art. The separation of the substrate can be achieved via known methods. The voids formed at the epilayer-substrate interface can either facilitate the separation, or reduce damages to the light-emitting layer, or do both during the separation. Finally, the exposed surface of the epitaxial layer is cleaned and refreshed for the following transparent n-type current spreading layer and contact formation.

It will be apparent to those skilled in the art that various modifications and variations can be made to the disclosed embodiments without departing from the scope or spirit of the invention. In view of the foregoing, it is intended that the invention cover modifications and variations of this invention provided they fall within the scope of the following claims and their equivalents.

What is claimed is:

1. A method for fabricating a light emitting device, comprising:
   providing a substrate having depressions and epitaxial growth portions alternately formed on a top surface thereof;
   depositing an epitaxial layer on the top surface of the substrate to cover, but not fully fill, the depressions, so that voids are formed in the depressions;
   forming a light emitting diode structure over the epitaxial layer;
   attaching the light emitting diode structure to a superstrate;
   separating the substrate from the epitaxial layer; and
   forming a transparent conductive layer and a contact pad on the epitaxial layer in place of the substrate.

2. The method according to claim 1, wherein the depressions are formed as parallel grooves or network grooves.

3. The method according to claim 2, wherein the depressions have a cross-sectional width in the range of 0.5 μm-5 μm and a depth in the range of 1 μm-10 μm.

4. The method according to claim 1, wherein each of the epitaxial growth portions has an epitaxial growth surface from which the epitaxial growth of the epitaxial layer starts, and a cross-sectional width of the epitaxial growth surface is in the range of 1 μm-10 μM.

5. The method according to claim 1, wherein the separation step is performed by laser lift-off.

6. The method according to claim 1, wherein the separation step is performed by etching.

7. A substrate assembly for growing a light emitting diode structure thereon, comprising:
   a substrate having depressions and epitaxial growth portions alternately formed on a top surface thereof, wherein the depressions are formed as parallel grooves or network grooves; and
   an epitaxial layer formed on the top surface of the substrate,
   wherein the epitaxial layer covers, but does not fully fill, the depressions, so that voids are formed in the depressions, wherein at least a portion of the voids are in fluid communication with each other and with outside environment.

8. The substrate assembly of claim 7, wherein each of the epitaxial portions has an epitaxial growth surface from which the epitaxial growth of the epitaxial layer starts, and a cross-sectional width of the epitaxial growth surface is in the range of 1 μm-10 μm.

9. The substrate assembly according to claim 7, wherein the depressions have a cross-sectional width in the range of 0.5 μm-5 μm and a depth in the range of 1 μm-10 μm.

10. The substrate assembly of claim 7, wherein a filling factor of the voids is in the range of 1%-20%.

11. The substrate assembly of claim 7, wherein a cross-sectional dimension of the voids is in the range from 0.5 to 5 μm.

12. The substrate assembly of claim 7, wherein the substrate is made of silicon, sapphire, GaAs, silicon carbide, or spinel.

13. The substrate assembly of claim 7, wherein the substrate comprises a material layer, the depressions are formed within the material layer, and the epitaxial layer is formed over the material layer.

14. The substrate assembly of claim 13, wherein the material layer comprises a silicon nitride layer.

15. A substrate assembly for growing a light emitting diode structure thereon, comprising:

a substrate having depressions and epitaxial growth portions alternately formed on a top surface thereof, wherein the substrate comprises a silicon nitride layer and the depressions are formed within the silicon nitride layer; and an epitaxial layer formed on the silicon nitride layer, wherein the epitaxial layer covers, but does not fully fill, the depressions, so that voids are formed in the depressions.

16. The method according to claim 2, wherein at least a portion of the voids are in fluid communication with each other and with outside environment.

17. The method according to claim 1, wherein the substrate comprises a material layer, the depressions are formed within the material layer, and the epitaxial layer is formed on the material layer.

18. The method according to claim 17, wherein the material layer comprises a silicon nitride layer.

19. The method according to claim 1, wherein the depressions are formed by surfaces having a Miller index higher than that of the epitaxial growth portions.

* * * * *